United States Patent [19]
Hendricks et al.

[11] Patent Number: 6,153,525
[45] Date of Patent: Nov. 28, 2000

[54] METHODS FOR CHEMICAL MECHANICAL POLISH OF ORGANIC POLYMER DIELECTRIC FILMS

[75] Inventors: Neil H. Hendricks, Sonora; Daniel L. Towery, Mountain View, both of Calif.

[73] Assignee: AlliedSignal Inc., Morristown, N.J.

[21] Appl. No.: 09/023,415

[22] Filed: Feb. 13, 1998

Related U.S. Application Data

[60] Provisional application No. 60/040,448, Mar. 13, 1997.

[51] Int. Cl.$^7$ .................................................. H01L 21/304
[52] U.S. Cl. .......................... 438/692; 438/633; 438/623; 438/693; 438/697
[58] Field of Search .................................... 438/633, 692, 438/693, 697, 623

[56] References Cited

U.S. PATENT DOCUMENTS

| | | | |
|---|---|---|---|
| 4,222,792 | 9/1980 | Lever et al. | 148/1.5 |
| 4,789,648 | 12/1988 | Chow et al. | 437/225 |
| 4,944,836 | 7/1990 | Beyer et al. | 156/645 |
| 5,302,233 | 4/1994 | Kim et al. | 156/636 |
| 5,376,590 | 12/1994 | Machida | 437/235 |
| 5,397,741 | 3/1995 | O'Conner et al. | 436/187 |
| 5,516,729 | 5/1996 | Dawson | 437/228 |
| 5,525,191 | 6/1996 | Maniar et al. | 156/636.1 |
| 5,612,254 | 3/1997 | Mu et al. | 437/195 |
| 5,705,028 | 1/1998 | Matsumoto | 156/636.1 |
| 5,888,905 | 3/1999 | Taylor | 438/705 |
| 5,930,652 | 7/1999 | Mukerji | 438/459 |
| 5,952,243 | 9/1999 | Forester | 438/693 |

FOREIGN PATENT DOCUMENTS

WO 9701864   1/1997   WIPO.

OTHER PUBLICATIONS

El–Kareh, Badih, Fundamentals of Semiconductor Processing, Kluwer Academic Publishers, Boston, pp. 568–570, 1995.

Wolf, Stanley, "Silcon Processing for the VLSI Era", vol. 2, pp. 232–234, 1990.

"Preimidization Chemical Mechanical Polishing Of Polyimide Coatings", Research Disclosure, No. 328, Aug. 1, 1991, p. 583. XP000217885.

Patent Abstracts of Japan, vol. 016, No. 200, (E–1201), May 13, 1992, & JP 04 030524 A (Fujitsu Ltd; others: 01), Feb. 3, 1992.

Research Disclosure No. 328, Aug. 1991, p. 583 Preimidization Chemical Mechanical Polishing of Polyimide Coatings.

Sivaram, et al, Solid State Technology, vol. 35, No. 5, May 1992, pp. 87–91 planarizing Interlevel Dielectrics by Chemical Mechanical Polishing.

Homma, et al, CMP–MIC Conference, Feb. 22–23, 1996, pp. 67–73, Selective CMP of Organic SOG for Low Parasitic Capacitance Quarter–Micron, Multilevel Interconnections.

*Primary Examiner*—Charles Bowers
*Assistant Examiner*—Lisa Kilday

[57] ABSTRACT

A process for the formation and planarization of polymeric dielectric films on semiconductor substrates and for achieving high chemical mechanical polish removal rates when planarizing these films. A cured, globally planarized, polymeric dielectric thin film is produced on a semiconductor substrate by (a) depositing a polymeric, dielectric film composition onto a surface of a semiconductor substrate; (b) partially curing the deposited film; (c) performing a chemical mechanical polishing step to said partially cured dielectric film, until said dielectric film is substantially planarized; and (d) subjecting the polished film to an additional curing step. Preferred dielectric films are polyarylene ether and/or fluorinated polyarylene ether polymers which are deposited by a spin coating process onto a semiconductor substrate. A thermal treatment partially cures the polymer. A chemical mechanical polishing step achieves global planarization. Another thermal treatment accomplishes a final cure of the polymer. In this way, the chemical mechanical polishing removal rate is increased compared to the removal rate for a fully cured polymer film.

19 Claims, 1 Drawing Sheet

METHODS FOR CHEMICAL MECHANICAL POLISH OF ORGANIC POLYMER DIELECTRIC FILMS

CROSS REFERENCE TO RELATED APPLICATION

This application claims the benefit of provisional application Ser. No. 60/040,448 filed Mar. 13, 1997, which is incorporated herein by reference.

BACKGROUND OF THE INVENTION

1. Field of the Invention

The present invention pertains to the formation and planarization of polymeric dielectric films on semiconductor substrates, and more particularly to a process for achieving high chemical mechanical polish removal rates when planarizing these films.

2. Description of the Prior Art

A continuing trend in semiconductor technology is the formation of integrated circuit (IC) chips having more and faster circuits thereon. Such ultralarge scale integration has resulted in a continued shrinkage of feature sizes with the result that a large number of devices are made available on a single chip. With a limited chip surface area, the interconnect density typically expands above the substrate in a multi-level arrangement and the devices have to be interconnected across these multiple levels. The interconnects must be electrically insulated from each other except where they are designed to make contact. Usually electrical insulation requires depositing or spinning dielectric films onto a surface. It is known in the art that organic polymer dielectric films have important applications in advanced integrated circuit multilayer interconnect fabrication. This is due to their superior electrical insulating characteristics compared to the standard integrated circuit interconnect insulator, silicon dioxide. It is well known that faster signal processing, lower power consumption, and reduced noise in circuitry results by the replacement of silicon dioxide by selected organic polymers, in particular those which have relatively low dielectric constants, such as those with dielectric constant values below 3.

Integrated circuits are typically fabricated as identical, adjacent units on a silicon wafer substrate. Fabrication involves sequential deposition and patterning of a large number of individual thin films comprised of a variety of conductors, insulators, and processing chemicals. A key processing difficulty associated with the formation of local interconnects is the topography of the device surface. Not only is the substrate surface itself quite non-planar, but device forming processes additionally create topographical irregularities. Loss of planarity can cause many problems which can adversely impact manufacturing yield including failure to open vias due to interlevel dielectric thickness disparity, poor adhesion to underlying materials, step coverage, as well as depth-of-focus problems. As optical lithography techniques are used to define smaller and smaller features, the depth of focus of the exposure tool decreases. In order to effectively fabricate multiple layers of interconnects it has become necessary to globally planarize the surface of certain layers during the multi-step process. Planarizing smoothes or levels the topography of microelectronic device layers in order to properly pattern the increasingly complex integrated circuits. IC features produced using photolithographic techniques require regional and global dielectric planarization where the lithographic depth of focus is extremely limited, i.e., at 0.35 $\mu$m and below. As used herein, the term "local planarization" refers to a condition wherein the film is planar or flat over a distance of 0 to about 5 linear micrometers. "Regional planarization" refers to a condition wherein the film is planar or flat over a distance of about 5 to about 50 linear micrometers. "Global planarization" refers to a condition wherein the film is planar or flat over a distance of about 50 to about 1000 linear micrometers. Without sufficient regional and global planarization, the lack of depth of focus will manifest itself as a limited lithographic processing window. Chemical mechanical polishing (CMP) has been effectively used in the art to essentially planarize the entire surface of such a layer. CMP has a unique advantage in that it can rapidly remove elevated topographical features without significantly thinning flat areas.

An important characteristic of a useful CMP process is a high removal rate of the films. Removal rates of nominally 2000 Å/minute to 4000 Å/min are currently considered to be relatively high, and rates below 1000 Å/min are generally considered to be relatively low. Assuming that other performance characteristics are not compromised, CMP removal rates of nominally 2000 Å/min to 4000 Å/min are desirable and acceptable in IC fabrication processes. Prior art methods for increasing the CMP removal rates include increasing the down force associated with the polishing pad impinging on the film being polished during the CMP process; increasing the size and/or concentration of particles contained in the polishing slurry used during the CMP process; modifying the chemical composition of the slurry solution, for example by changing the pH, addition of surfactants or dispersants; and utilizing a CMP polishing pad constructed of a relatively harder material.

With the introduction of organic polymer dielectrics in place of silicon dioxide as the IC interconnect insulator, a need exists for methods to conduct efficient CMP of polymer films. Unfortunately, organic polymer films typically exhibit low CMP removal rates when fully cured and subsequently polished with slurries designed for $SiO_2$ based dielectrics. Under a variety of experimental conditions, quite low values (for example, less than 1000 Å/min) are observed for dielectric films prepared from such polymer chemical compositions as polyarylene ethers and fluorinated polyarylene ethers. Examples of other organic polymer dielectrics and articles produced therefrom are disclosed in U.S. Pat. Nos. 5,145,936; 5,108,840; 5,115,082;5,114,780; 5,155,175; 5,179,188; 5,250,667; 5,235,044; 5,173,542; and 5,270,453. In all these cases, prior to carrying out the CMP process, the films were deposited from a lacquer by spin-coating on to the silicon substrate, and then subjected to a full thermal cure.

Polymeric films which are deposited in thin film form using lacquers and spin-coating techniques have a distinctive characteristic when compared to polymeric films which are deposited by physical or chemical deposition techniques (PVD or CVD respectively). In the case of the spin-on films, they invariably require curing to harden and set the film. It would be desirable to provide an improved process whereby polymeric films of the type mentioned could be subjected to a CMP planarization treatment a high film removal rate.

The present invention provides a method for achieving a high CMP removal rate with organic polymer dielectrics using CMP techniques and conditions. It has been found that when polymeric dielectric thin films are deposited by spin coating, the CMP polish rates are a function of the extent of cure of the films. According to the process of the invention, the deposited films are partially cured, subjected to CMP and then subjected to a final cure. It has been found that if the deposited polymer films are only partially cured, their CMP removal rates are much higher, on the order of about 2000 Å/min or higher, when compared to the removal rates for similar films which are more fully cured prior to CMP. For these latter, fully cured films, CMP removal rates under standard conditions are typically less than about 1000 Å/min. The present invention also provides a method for tailoring the CMP removal rate for dielectric polymers by first forming a calibration curve composed of data plotting the CMP removal rate as a function of the degree of cure, and tailoring the CMP removal rate to determine a desired value over the accessible removal rate range.

SUMMARY OF THE INVENTION

The invention provides a process for forming a cured, globally planarized, polymeric dielectric thin film on a semiconductor substrate comprising the steps of:

(a) depositing a polymeric, dielectric film composition onto a surface of a semiconductor substrate;

(b) partially curing the deposited film;

(c) performing a chemical mechanical polishing step to said partially cured dielectric film, until said dielectric film is substantially planarized; and (d) subjecting the polished film to an additional curing step.

The invention also provides a process for forming a cured, globally planarized, polymeric dielectric thin film on a semiconductor substrate comprising the steps of:

(a) spin depositing a liquid polymeric, dielectric film composition onto a surface of a semiconductor substrate;

(b) heating said dielectric layer at a temperature and for a time sufficient to form a continuous, dry dielectric layer on the surface and to partially cure the deposited film;

(c) performing a chemical mechanical polishing step to said partially cured dielectric film to remove a portion of the dielectric layer until said dielectric film is substantially planarized; and (d) subjecting the polished film to an additional curing step.

DESCRIPTION OF THE PREFERRED EMBODIMENT

Figure 1:
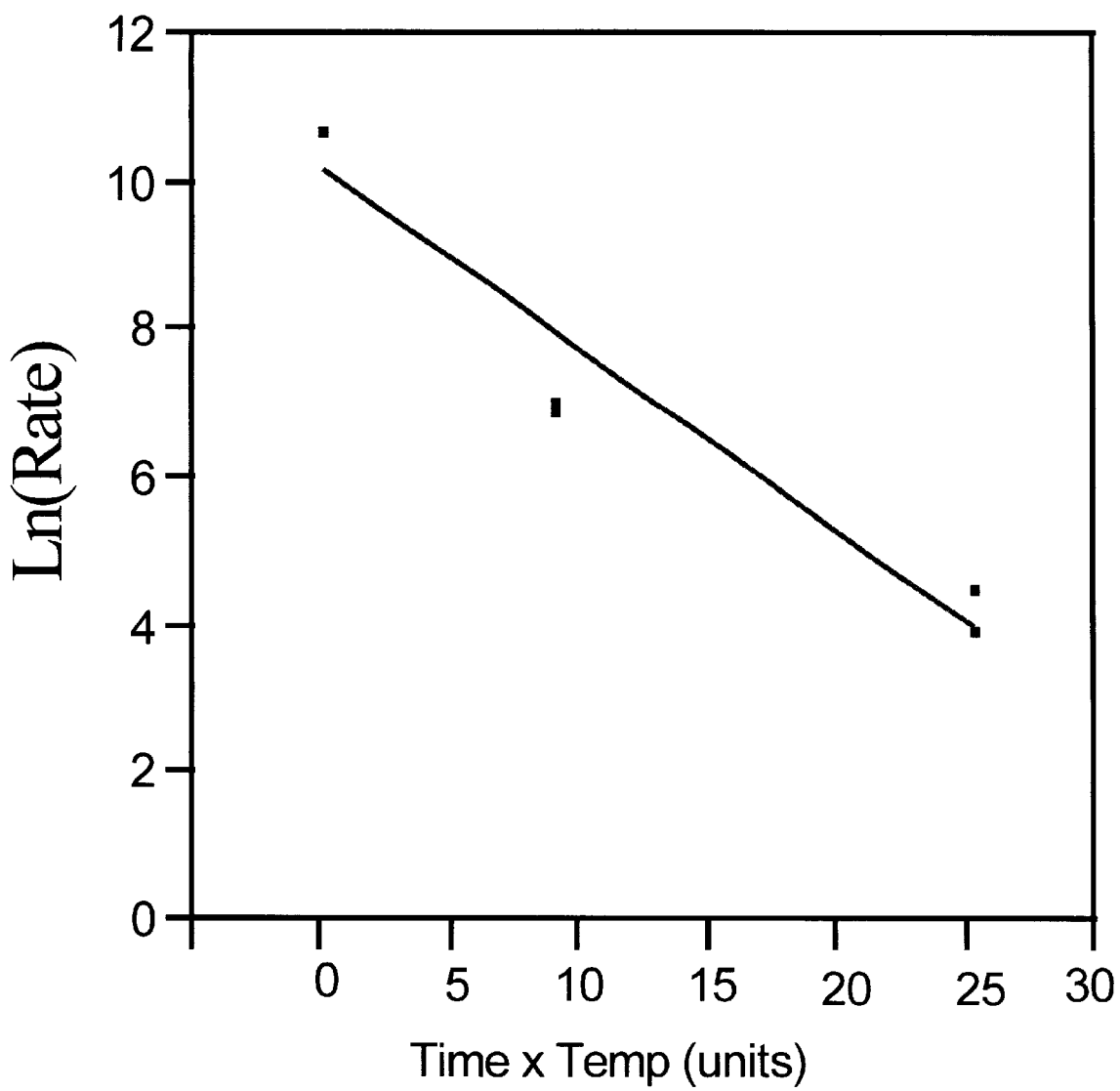
FIG. 1 is a graph of the natural log of the CMP removal rate vs. normalized curing energy obtained by multiplying the curing time by the cure temperature.

According to the invention, it has been found that an IC fabrication line can be improved by partially curing a coated polymeric dielectric film followed by global planarization using a CMP process and then more fully curing. The polymeric dielectric film is deposited onto a semiconductor substrate. Following deposition, the film can be partially cured by sequential heat treatment with a series of hot plates. Following partial curing, the film is subjected to CMP under standard conditions to achieve global planarization to a desired degree and preferably at a relatively high removal rate. Following the CMP treatment step (c) but before additional cure step (d), a conventional post-polish cleaning step or steps may be employed to remove particles and other residues from the polished film. The planarized film is then fully cured in a conventional manner, such as by exposure of the coated wafers in a furnace. The coated wafers are then further processed as desired.

Typically the dielectric compositions are applied onto wafer substrates, which are to be processed into an IC or another microelectronic device. Suitable planar substrates for the present invention non-exclusively include gallium arsenide (GaAs), silicon and compositions containing silicon such as crystalline silicon, polysilicon, amorphous silicon, epitaxial silicon, and silicon dioxide ($SiO_2$) and mixtures thereof, which may or may not have a circuit pattern on their surface. Typically, the substrates have a diameter in the range of from about 2 inches (50 mm) to about 12 inches (305 mm), although the present invention would still be effective for larger or smaller substrates.

A liquid dielectric layer, preferably a spin-on glass in a suitable solvent is applied to the substrate surface under ambient conditions. The dielectric film composition comprises a silicate, phosphosilicate, siloxane, silsesquioxane, organic polymer and copolymers and mixtures thereof. Useful dielectrics include, polyimides, crosslinked polyarylene ethers, benzocyclobutene and copolymers containing any of these. Polymeric dielectric materials useful for the invention include hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention non-exclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. The hydroorganosiloxanes, polyarylene ethers, fluorinated polyarylene ethers and mixtures thereof are preferred. Preferred organic polymers include fluorinated and non-fluorinated polymers, in particular fluorinated and non-fluorinated poly(arylethers) available under the tradename FLARE™ from AlliedSignal Inc., and copolymers mixtures thereof. Preferred siloxane materials suitable for use in this invention are commercially available from AlliedSignal Inc. under the tradename Accuglass®. The polymer component is preferably present in an amount of from about 10% to about 30% by weight of the composition. A more preferred range is from about 15% to about 30% and most preferably from about 17% to about 25% by weight of the composition.

The composition contains a solvent component comprising at least one solvent. Suitable solvents non-exclusively include water and organic solvents in an amount sufficient to form a uniform solution or dispersion of the dielectric material. Examples of useful linear solvents nonexclusively include decamethyltetrasiloxane, 1,3-dioctyltetramethyldisiloxane, octamethyltrisiloxane, pentamethyldisiloxane, hexamethyldisiloxane, 1,1,3,3,5,5-hexamethyltrisiloxane, 1,1,3,3-tetramethyldisiloxane, 1,3- bis-(trimethylsiloxy)-1,3-dimethylsiloxane, bis (trimethylsiloxy)ethylsilane, bis(trimethylsiloxy) methylsilane, decamethyltetrasiloxane, dodecamethylpentasiloxane, 1,1,1,3,3,5,5-heptamethyltrisiloxane, hexaethyldisiloxane, heptamethyltrisiloxane and 1,1,3,3-tetraisopropyldisiloxane. Examples of useful cyclic solvents nonexclusively include decamethylcyclopentasiloxane, hexaethylcyclotrisiloxane, hexamethylcyclotrisiloxane, 1,3,5,7-tetramethylcyclotetrasiloxane, pentamethylcyclopentasiloxane, octamethylcyclotetrasiloxane, methylhydrocyclosiloxanes of the formula $(CH_3HSiO)_{3-5}$, 1,3,5,7-tetraethylcyclotetrasiloxane and 1,3,5,7-tetramethylcyclotetrasiloxane. It has been found that blends of the solvents of this invention are particularly preferred since by forming such blends one is able to fine tune the evaporation rate of the composition on a substrate. The solvent component is preferably present in the overall composition in an amount of from about 70% to about 90% by weight of the composition, more preferably from about 70% to about 85% and most preferably from about 75% to about 83% by weight of the composition.

The dielectric material may be applied to the substrates via conventional spin-coating, dip coating, spraying, or meniscus coating methods which are well-known in the art. Spin coating is most preferred. The thickness of the dielectric film on the substrate may vary depending on the amount of liquid dielectric that is applied to the substrate, but typically the thickness may range from about 500 Å to about 2 microns, and preferably from about 3000 Å to about 9000 Å. The amount of dielectric liquid applied to the substrate may vary from about 1 ml to about 10 ml, and preferably from about 2 ml to about 8 ml. In the preferred embodiment, the liquid material is spun onto the upper surface of the substrate according to known spin techniques. Preferably, the dielectric is applied from a solution which is centrally applied to the substrate and then spun on a rotating wheel at speeds ranging between about 500 and about 6000 rpm, preferably between about 1500 and about 4000 rpm, for about 5 to about 60 seconds, preferably about 10 to about 30 seconds, in order to spread the solution evenly across the substrate surface.

After the dielectric material is applied to the substrate, the dielectric-substrate combination is heated for a time and at a temperature sufficient to evaporate any residual solvent present within the dielectric film and partially cure the film. This produces a continuous, dry, partially cured dielectric film on the substrate. The desired degree of partial curing may be determined by one skilled in the art without undue experimentation. A change in the density and chemical properties of the dielectric affords a change in its susceptibility to CMP removal. An increase in temperature or exposure time to heat will incrementally change the chemical and mechanical properties of the dielectric layer thereby bringing about a change in CMP removal rate. Removal can be fixed at a higher or lower rate according to the properties of the dielectric layer material and the particular CMP chemical slurry and mechanical pressure conditions being applied. Generally, the dielectric coated substrate is heated at a temperature of from about 50° C. to about 400° C., more preferably from about 50° C. to about 250° C. for about 0.5 to about 10 minutes, more preferably from about 1 to about 3 minutes. This is preferably done on a hot plate but may also be done in an oven. In a preferred embodiment, the dielectric is first heated at about 50° C. for about 30 seconds to one minute, then heated at about 150° C. for about 30 seconds to one minute, and heated a third time at about 250° C. for about 30 seconds to one minute. The liquid dielectric material partially crosslinks and solidifies as a result of such heating. After the coating is heated, the thickness of the resulting film ranges from about 0.2 to about 3.0 micrometers, preferably from about 0.5 to about 2.5 micrometers, and most preferably from about 0.7 to about 2.0 micrometers. Such curing may also be performed by electron beam exposure by methods well known in the art. The films produced by this invention generally exhibit a thickness standard deviation less than 2%, and preferably less than 1%, of the average film thickness.

After the dielectric layer is partially cured, one performs a CMP to the dielectric layer according to known techniques. Details of such techniques are well known in the art, see for example, U.S. Pat. No. 5,516,729 which is incorporated herein by reference. In general, the chemical mechanical polish step is conducted by abrading the dielectric layer, typically with an abrasive powder slurry comprised of a silica such as an alkali silica, acidic silica, a fumed silica or oxides of metals such as zirconium, cerium, chromium, manganese, aluminum, tin, lanthanum, silica, copper, iron, magnesium, titanium, tungsten, zinc, and mixtures thereof. Other abrasives can include diamond, graphite, silicon carbide, zirconium carbide, etc. Abrasion is done using a polishing pad such as a foamed urethane polishing pad employing a pressure of from about 2 to about 20 lbs/in$^2$, preferably from about 5 to about 10 lbs/in$^2$. Among the slurries that can be used are zirconium oxide or cerium oxide having a particle size of from about 14 to about 250 nm, and preferably from about 14 to about 160 nm. Preferably the slurry composition has a pH range of from about 2.8 to about 11, or more preferably from about 10.3 to about 11. Particularly useful slurry materials nonexclusively include SC112, which is a fumed silica available commercially from Cabot Corporation of Aurora, Ill. and has a pH of 10.3; ILD1300 which is a fumed silica available commercially from Rodel Corporation of Scottsdale, Ariz. and has a pH of 11.0 and SS25 which is a fumed silica available commercially from Cabot Corporation and has a pH of 10.8. Preferably CMP is done with a commercially available polisher such as a Avanti 372 or 472 from IPEC/Westech, having a platen speed of from about 10 to about 100 rpm, preferably from about 25 to about 60 rpm and a downward pressure from a polishing pad to the dielectric surface of from about 5 psi (3.5 gm/mm$^2$) to about 20 psi (14.1 gm/mm$^2$), preferably from about 7 psi (49.2 gm/mm$^2$) to about 11 psi (77.3 gm/mm$^2$). CMP may be conducted for from about 0.5 to about 60 minutes, preferably from about 0.5 to about 30 minutes and more preferably from about 0.5 to about 60 minutes. The amount of dielectric layer typically removed depends on the dielectric layer thickness applied.

After CMP, the dielectric layer receives a final curing cycle at a level and duration necessary to densify and change the chemical composition of the dielectric layer. In the preferred curing embodiment, the dielectric layer is heated to cause an incremental mechanical hardening and chemical change in the dielectric composition under temperatures of from about 250° C. to about 1,000° C. for a period of from about 5 minutes to about 240 minutes, more preferably from about 300° C. to about 800° C. for from about 30 minutes to about 120 minutes, and most preferably from about 350° C. to about 450° C. for from about 30 minutes to about 120 minutes to further cure the layer. Curing may also be done by electron beam exposure.

The invention allows tailoring the CMP removal rate for the dielectric polymers by first forming a calibration curve composed of data plotting the CMP removal rate as a function of the degree of cure, as quantified by the time and temperature exposure conditions on the deposited film. For example, in the case of a particular polyarylene ether, a roughly linear relationship exists for the natural log of removal rate as a function of the degree of cure. By utilizing the calibration curve, it is possible to tailor the subsequent CMP removal rate to a particular degree of cure. For example, once a CMP removal rate is selected, the degree of cure time at a particular temperature is determined. Thus, the film can be subjected to such curing conditions, and then subjected to the desired CMP removal rate. It is noted that a certain minimum extent of cure, for example about 30–60 seconds on a hot plate at about 150° C., is needed to harden the film to the extent required for polishing without grossly distorting the film during CMP through plastic deformation. The CMP removal rate for the polymers may thus be determined by first forming a calibration curve composed of data plotting the CMP removal rate as a function of the degree of cure, and tailoring the CMP removal rate to determine an end point. The tailoring of the CMP removal rate of dielectric polymer such as a polyarylene ether or fluorinated polyarylene ether film would comprise the steps of determining the relationship between CMP removal rate vs. time of exposure at a particular temperature thermal treatment; selecting a desired CMP removal rate within the relationship range; using this relationship to select the thermal treatment corresponding to the desired removal rate over the accessible removal rate range; subjecting the film to the thermal treatment determined from the relationship for the desired removal rate; and subjecting the thermally treated film to the selected CMP removal rate to thereby achieved global planarization.

The following non-limiting example serves to illustrate the invention.

EXAMPLE 1

Experiments were conducted to determine the CMP response of films of FLARE™ 2.0, a poly(arylether) available from AlliedSignal Inc. as a function of various parameters, in particular, to determine the role cure energy plays in the CMP response.

Wafer Sample Preparation

Films were prepared by spinning ~7.2 KÅ of FLARE™ 2.0 polymer onto 150 mm primed silicon wafers having an underlying 10 KÅ thermal oxide film. The film thicknesses of the experimental samples were measured on a Tencor SM300 using the appropriate film constants. The spin-coat, bake, and cure conditions for the samples are given in Table 1.

Table 1

Spin and Bake Conditions for FLARE 2.0 Polymer Samples 5 ml static dispense, spin at 500 rpm for 5 seconds, 0 rpm for 5 seconds, 2000 rpm for 60 seconds, heat at 150° C. for 60 seconds.

TABLE 1

| Samples 1–2 | No Cure |
|---|---|
| Samples 3–4 | Cure at 300° C. for 30 minutes in $N_2$ |
| Samples 5–6 | Cure at 425° C. for 60 minutes in $N_2$ |

Polishing Parameters

A CMP was performed on an IPEC 472 polisher using a flat wafer carrier and a perforated IC 1000/SubaIV pad stack. The polishing process parameters are given in Table 2. Under the polishing conditions, the wafer's linear velocity with respect to the pad was determined to be 90.17 ft/min (0.46 m/s).

TABLE 2

| CMP Tool | IPEC 472 |
|---|---|
| CMP Pad | Rodel IC1400 |
| Carrier film | Rodel R200 T-3 (12 hole) |
| CMP Time | 2 min |
| Polish Pressure | 7 psi (4.921 gm/mm$^2$) |
| Back Pressure | 0.5 psi (.351 gm/mm$^2$) |
| Carrier curvature | Flat |
| Platen RPM | 24 |
| Carrier RPM | 32 rpm |
| Slurry | Cabot SS12 |
| Slurry flow rate | ~175 ml/min |
| End Effector | 4" dia. (10.1 cm), 100 grit, TBW |
| Sweep profile | "Flat" 0.5 . . . 0.5; 24 sweep, 5 lbs (2.27 kg) |
| Wafer Track | 180 mm–185 mm |
| Wafer Osc. speed | 2 mm/sec |
| Platen Temp. | 110° Fahrenheit (43° C.) |

Description of the Slurries Used for the Tests

The CMP slurry was commercially available oxide Cabot SS-12 slurry. This slurry is comprised of fumed-$SiO_2$ particles dispersed in an aqueous medium with a pH of 11.0. KOH was used as the pH modifier for the SS-12, and the specific gravity of the slurry was approximately 1.072. The energy value is a normalized energy value derived by multiplying the cure and/or bake temperature by the amount of time during the cure and/or bake process. In the case of the two bake only samples, the film was removed almost immediately. This is based on the removal rate of the underlying thermal oxide film, which was essentially the same as the thermal oxide control wafers polished before and after experimental runs. Based on this result, a rate estimation of 50,000 Å/min was determined for the bake only samples. It is evident that acceptable removal rates for can be obtained by conducting a partial film cure prior to CMP. The samples which were partially cured prior to polish appear to have acceptable surface quality, and uniformity. The results of this example indicate that organic spin-on dielectric materials can be polished with conventional oxide CMP slurry provided that the film is partially cured prior to CMP. A partial cure prior to CMP indicates that a full cure is required after CMP. Finally, the form of the fitted equation for rate vs. cure energy suggests that as the cure energy is reduced the rate becomes very sensitive to slight aberrations in the cure energy.

EXAMPLE 2

Wafer samples are prepared as in Example 1. The extent to which the curing process affects the CMP behavior of FLARE™ polymer was determined by polishing wafers which had undergone three different thermal curing processes. Two wafers received only a 150° C. hot-plate bake for 1 minute, two wafers received the same bake, plus an additional furnace cure at 300° C. for 30 minutes, and two wafers were baked at 150° C. for 1 minute and cured at 425° C. for 1 hour. All the baking and curing processes were performed in a $N_2$ ambient to prevent oxidation of the film. The wafers were then polished for 2 minutes using a commercially available IC pad and a commercially available, alkaline $SiO_2$-based slurry at a pressure of 48.27× $10^3$ Pa (7.0 psi) and a linear velocity of 0.53 m/s. FIG. 1 shows the results of this test. The x-axis of FIG. 1 is obtained by multiplying the curing time in minutes by the cure temperature in °C. The y-axis is the natural log of the removal rate. The baked-only wafers were completely stripped of FLARE™ polymer. The removal rate assigned to these wafers was estimated based on the measured removal rate of an underlying thermal oxide film. The measured removal of the underlying thermal oxide film, indicates the FLARE™ polymer was stripped within a few seconds of commencing CMP, resulting in a very high estimated removal rate.

EXAMPLE 3

Two wafer samples are prepared as in Example 1. All wafers receive a 150° C. hot-plate bake for 1 minute, one wafer receives the same bake, plus an additional furnace cure at 300° C. for 30 minutes, and one wafer is baked at 150° C. for 1 minute and cured at 425° C. for 1 hour. All the baking and curing processes are performed in a $N_2$ ambient to prevent oxidation of the film. The wafers are then polished for 2 minutes using a commercially available IC pad and a commercially available, alkaline $SiO_2$-based slurry at a pressure of $48.27 \times 10^3$ Pa (7.0 psi) and a linear velocity of 0.53 m/s. Subsequently the wafers are baked to a final cure.

As one can see, the chemical mechanical polishing removal rate for a partially cured polymer film is increased compared to the removal rate for a fully cured polymer film.

What is claimed is:

1. A process for forming a cured, globally planarized, polymeric dielectric thin film on a semiconductor substrate comprising the steps of:
   (a) depositing a polymeric, dielectric film composition onto a surface of a semiconductor substrate, wherein the polymeric, dielectric film composition comprises a material selected from the group consisting of silicates, phosphosilicates, siloxanes, silsesquioxane, polyarylene ethers, crosslinked polyarylene ethers, fluorinated polyarylene ethers, benzocyclobutene, polyarylene ethers and mixtures thereof;
   (b) partially curing the deposited film;
   (c) performing a chemical mechanical polishing step to said partially cured dielectric film, until said dielectric film is substantially planarized; and
   (d) subjecting the polished film to an additional curing step.

2. The process of claim 1 wherein step (a) is conducted by a spin coating process.

3. The process of claim 1 wherein step (b) is conducted by heating the dielectric film composition and substrate at a temperature and for a time sufficient to form a continuous, dry partially cured dielectric film on the surface.

4. The process of claim 1 wherein step (b) is conducted by heating the dielectric film composition and substrate at a temperature of from about 50° C. to about 400° C. for from about 0.5 minute to about 10 minutes.

5. The method of claim 4 wherein step (b) comprises subjecting the deposited film to heating by a series of hot plates.

6. The process of claim 1 wherein the chemical mechanical polishing is conducted with an abrasive comprising silica and with a pressure on the dielectric film of from about 2 to about 20 lbs/in².

7. The process of claim 1 wherein the chemical mechanical polishing is conducted with an abrasive selected from the group consisting of diamond, graphite, silicon carbide, zirconium carbide, an alkali silica, acidic silica, fumed silica, and oxides of zirconium, cerium, chromium, manganese, aluminum, tin, lanthanum, silica, copper, iron, magnesium, titanium, tungsten, zinc, and mixtures thereof.

8. The process of claim 1 wherein the chemical mechanical polishing is conducted at a film removal rate of from about 2000 Å/minute to about 4000 Å/minute.

9. The process of claim 1 wherein step (d) is conducted by heating at a temperature of from about 250° C. to about 1,000° C. for from about 5 minutes to about 240 minutes.

10. The process of claim 1 wherein the dielectric film composition comprises a polyarylene ether, a fluorinated polyarylene ether or mixtures thereof and an organic solvent.

11. The process of claim 1 wherein the dielectric film composition comprises at least one polymer having a formula selected from the group consisting of $[(HSiO_{1.5})_xO_y]_n$, $(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl.

12. The process of claim 1 further comprising a step of cleaning the polished film following step (c) but before step (d) to remove particles and residues from the polished film.

13. The process of claim 1 wherein the substrate comprises silicon or gallium arsenide.

14. A process for forming a cured, globally planarized, polymeric dielectric thin film on a semiconductor substrate comprising the steps of:
   (a) spin depositing a liquid polymeric, dielectric film composition onto a surface of a semiconductor substrate, wherein the polymeric, dielectric film composition comprises a material selected from the group consisting of silicates, phosphosilicates, siloxanes, silsesquioxane, polyarylene ethers, crosslinked polyarylene ethers, fluorinated polyarylene ethers, benzocyclobutene, polyarylene ethers and mixtures thereof;
   (b) heating said dielectric layer at a temperature and for a time sufficient to form a continuous, dry dielectric layer on the surface and to partially cure the deposited film;
   (c) performing a chemical mechanical polishing step to said partially cured dielectric film to remove a portion of the dielectric layer until said dielectric film is substantially planarized; and
   (d) subjecting the polished film to an additional curing step.

15. The process of claim 14 wherein the dielectric film composition comprises a polyarylene ether, a fluorinated polyarylene ether or mixtures thereof.

16. The process of claim 14 wherein step (b) is conducted by heating the dielectric film composition and substrate at a temperature of from about 50° C. to about 400° C. for from about 0.5 minute to about 10 minutes.

17. The process of claim 14 wherein the chemical mechanical polishing is conducted at a film removal rate of from about 2000 Å/minute to about 4000 Å/minute.

18. The process of claim 14 wherein step (d) is conducted by heating at a temperature of from about 250° C. to about 1,000° C. for from about 5 minutes to about 240 minutes.

19. The process of claim 14 further comprising a step of cleaning the polished film following step (c) but before step (d) to remove particles and residues from the polished film.

* * * * *